(12) United States Patent
Calzaferri (10) Patent No.: US 7,372,012 B2
(45) Date of Patent: May 13, 2008

(54) DYE LOADED ZEOLITE MATERIAL CONTAINING DEVICES

(75) Inventor: Gion Calzaferri, Bremgarten bei Bern (CH)

(73) Assignee: Universitaet Bern, Bern (CH)

( * ) Notice: Subject to any disclaimer, the term of this patent is extended or adjusted under 35 U.S.C. 154(b) by 484 days.

(21) Appl. No.: 11/173,163

(22) Filed: Jul. 5, 2005

(65) Prior Publication Data
US 2006/0001004 A1 Jan. 5, 2006

Related U.S. Application Data

(62) Division of application No. 10/415,734, filed as application No. PCT/CH01/00647 on Nov. 5, 2001, now Pat. No. 6,932,919.

(60) Provisional application No. 60/246,153, filed on Nov. 3, 2000.

(51) Int. Cl.
 H01J 40/14 (2006.01)
 C09K 11/06 (2006.01)
 C01B 39/32 (2006.01)
 H01L 31/06 (2006.01)

(52) U.S. Cl. .............. 250/214.1; 252/301.16; 106/400; 106/401; 106/499; 257/E51.047

(58) Field of Classification Search ............. 250/214.1; 252/301.16; 106/499, 483, 400, 401; 257/E51.047
See application file for complete search history.

(56) References Cited

U.S. PATENT DOCUMENTS 5,573,585 A 11/1996 Lauth et al.

(Continued)

FOREIGN PATENT DOCUMENTS

DE 41 26 461 A1 2/1993

(Continued)

OTHER PUBLICATIONS

Cox, S.D., et al., "Second Harmonic Generation by the Self-Aggregation of Organic Guests In Molecular Sieve Hosts", Chem. Mater. 2(5), 1990, pp. 609-619.

(Continued)

*Primary Examiner*—John R. Lee
(74) *Attorney, Agent, or Firm*—Joyce von Natzmer; Pequignot + Myers LLC (57) ABSTRACT

The present invention provides a dye loaded zeolite material comprising: a) at least one zeolite crystal having straight through uniform channels each having a channel axis parallel to, and a channel width transverse to, a c-axis of crystal unit cells; b) closure molecules having an elongated shape and consisting of a head moiety and a tail moiety, the tail moiety having a longitudinal extension of more than a dimension of the crystal unit cells along the c-axis and the head moiety having a lateral extension that is larger than said channel width and will prevent said head moiety from penetrating into a channel; c) a channel being terminated, in generally plug-like manner, at least at one end thereof located at a surface of the zeolite crystal by a closure molecule hose tail moiety penetrates into said channel and whose head moiety substantially occludes said channel end while projecting over said surface; and d) an essentially linear arrangement of luminescent dye molecules enclosed within a terminated channel adjacent to at least one closure molecule and exhibiting properties related to supramolecular organization.

15 Claims, 5 Drawing Sheets

U.S. PATENT DOCUMENTS 6,932,919 B2 * 8/2005 Alzaferri ............... 252/301.16

FOREIGN PATENT DOCUMENTS

DE 199 13395 A1 9/2000

OTHER PUBLICATIONS

Stucky, G.D., et al, "Quantum Confinement and Host/Guest Chemistry: Probing a New Dimension", Science 247, 1990, pp. 669-678.

Brühwiler, D., et al, "Quantum-Sized Silver Sulfide Clusters in Zeolite A", J. Phys. Chem. B 103(31), Aug. 1999, pp. 6397-6399.

Vietze, U., et al, "Zeolite-Dye Microlasers", Phys. Rev. Lett. 81(21), 1998, pp. 4628-4631.

Wöhrle, D., et al, "Molecular Sieve Encapsulated Organic Dyes and Metal Chelates", Adv. Mater. 6(11), 1994, pp. 875-880.

Ozin, G.A., et al, Advanced Zeolite Materials Science, Angew. Chemie 101(3), 1989, pp. 373-390.

Lainé, P., et al, "Limits of the in Situ Synthesis of Tris(2,2'-bipyridine)ruthenium(II) in the Supercages of Zeolite Y", Inorg. Chem. 35(12), 1996, pp. 3514-3518.

Seifert, R., et al, "The yellow color of silver-containing zeolite A", Angew. Chem. Int. Ed. 37 (11), 1998, pp. 1521-1524.

Brühwiler, D., et al, "Resorufin in the Channels of Zeolite L", J. Phys. Chem. B 102(16), 1998, pp. 2923-2929.

Ramamurthy, V., et al, "Control of Dye Assembly within Zeolites: Role of Water", J. Am. Chem. Soc. 115, 1993, pp. 10438-10439.

Gfeller, N., et al, "Energy Migration in Dye-Loaded Hexagonal Microporous Crystals", J. Phys. Chem. B 101(8), 1997, pp. 1396-1408.

Gfeller, N., et al, "Fast Energy Migration In Pyronine-Loaded Zeolite L Microcrystals", J. Phys. Chem. B 103(8), 1999, pp. 1250-1257.

Gfeller, N., et al, "Transfer of Electronic Excitation Energy between Dye Molecules in the Channels of Zeolite L", J. Phys. Chem. B 102(14), 1998, pp. 2433-2436.

Calzaferri, G., "Zeolite Microcrystals as Hosts for Supramolecular Organization of Dye Molecules", Chimia 52(10), 1998, pp. 525-532.

Calzaferri, G., "Dye Molecules in zeolite L nano crystals for efficient light harvesting", in *Photofunctional Zeolites*, Nova Science Publishers NY, 2000, pp. 205-218, Editor M. Anpo.

Pauchard, M., et al, "Dye-Loaded Zeolite L Sandwiches as Artificial Antenna Systems for Light Transport", Chem. Eur, J. 6(18), Sep. 2000, pp. 3456-3470.

Calzaferri, G., et al, "Playing with dye molecules at the inner and outer surfaces of zeolite L", Solid State Sciences 2, Jun. 2000, pp. 421-447.

* cited by examiner

Fig. 1

Pyronine (Py)

Oxonine (Ox)

Resorufin (Res)

Hydroxy-TEMPO

Biphenyl (BP)

p-Terphenyl (pTP)

1,6-Diphenylhexatriene (DPH)

1,2-bis-<5-methyl-benzoxazol-2-yl>-ethene (MBOXE)

6-(((4-(4,4-difluoro-5-(2-thienyl)-4-bora-3a,4a-diaza-s-indacene-3-yl)phenoxy)acetyl)amino)hexanoic acid succinimidyl ester Schematic representation of a closure molecule 4,5-difluoro-5,7-diphenyl-4-bora-3a,4a-diaza-s-indacene-3-propionyl ethylenediamine hydrochloride Benzoxazolium,-[3-[5,6-dichloro-1,3-dihydro-1,3-bis[(4-methylphenyl)methyl]-2H-benzimidazol-2-ylidene]-1-propenyl]-3-methyl-, chloride (9CI) (MitoFluor Green)

Molecule C

Molecule D

Pyridinium, 4-[2-[4-[bis(9,12-octadecadienyl)amino]phenyl]ethenyl]-1-methyl- (9CI)

Fig. 6

Pyronine G

Fluorenone

Trans-4-dimethyl-amino-4'cyanostilbene

Trans-4-acetidinyl-4'-cyanostilbene

Dimethyl-POPOP

DYE LOADED ZEOLITE MATERIAL CONTAINING DEVICES

CROSS REFERENCE TO RELATED APPLICATIONS

This application is a divisional application of application Ser. No. 10/415,734, filed May 2, 2003 now U.S. Pat. No. 6,932,919 which was the National Stage of International Application No. PCT/CH01/00647, filed Nov. 5, 2001, which claims the benefit of U.S. Provisional Application No. 60/246,153, filed Nov. 3, 2000. The contents of these applications are incorporated herein by reference in their entirety.

BACKGROUND OF THE INVENTION

1. Field of the Invention

The present invention relates to the technical field of optical materials and devices. In particular, the invention relates to a dye loaded zeolite material; the invention further relates to a pigment material, a luminescent optical device, an optical sensor device, a light emitting device and a photonic energy harvesting device, all the afore-said comprising a dye loaded zeolite material.

2. Description of the Prior Art

The structural, morphological, physical, and chemical variety of zeolites has led to applications in different fields like catalysis, ion exchange, membranes, and chemical sensors where dynamic processes involving ions or adsorbate molecules play an important role (Thomas, J. M. *Spektrum der Wissenschaft*, June 1992, 88). Situations where the zeolites mainly serve as host for supramolecular organization of molecules, ions, complexes and clusters to prepare materials with new properties such as nonlinear optical (Cox, S. D.; Gier, T. E.; Stucky, G. D. *Chem. Mater.* 1990, 2, 609), quantum-size (Stucky, G. D.; MacDougall, J. E. *Science* 1990, 247, 669; Brühwiler, D.; Seifert, R.; Calzaferri, G. *J. Phys. Chem B* 1999, 103, 6397), micro laser (Vietze, U.; Krauss, O.; Laeri, F.; Ihnlein, G.; Schüth, F.; Limburg, B.; Abraham, M. *Phys. Rev. Lett.* 1998, 81, 4628) and artificial antenna characteristics are new fields of growing interest (Wöhrle, D.; Schulz-Ekloff, G. *Adv. Mater.* 1994, 6, 875; Schüth, F. *Chemie in unserer Zeit* 1995, 29, 45; Ozin, G. A.; Kuperman, A.; Stein, A. *Angew. Chem* 1989, 101, 373.).

Some of these new materials can be considered as static and stable arrangements of guests in the zeolite host under a broad range of conditions (Lainé, P.; Lanz, M.; Calzaferri, G. *Inorg. Chem.* 1996, 35, 3514). In other cases, however, the adsorption, desorption or ion exchange of molecules or ions are reversible processes which lead to a wide range of phenomena (Seifert, R.; Kunzmann, A.; Calzaferri, G. *Angew. Chem. Inst. Ed.* 1998, 37, 1521; Brühwiler, D.; Gfeller, N.; Calzaferri, G. *J. Phys. Chem. B* 1998, 102 ,2923; Ramamurthy, V.; Sanderson, D. R.; Eaton, D. F. *J. Am. Chem. Soc.* 1993, 115, 10438.).

Plants are masters of efficiently transforming sunlight into energy. In this process, every plant leaf acts as a photonic antenna system, wherein photonic energy in the form of sunlight is transported by chlorophyll molecules for the purpose of energy transformation. Accordingly, the synthesis, characterization and possible application of an artificial photonic antenna for harvesting light within a certain volume and for transport of the resultant molecular electronic excitation energy to a specific location of molecular size has been the target of research of several laboratories. Imaginative attempts to build an artificial photonic antenna have been reported, including multinuclear luminescent metal complexes, multichromophore cyclodextrines, Langmuir-Blodgett films, and dyes in polymers. Sensitization processes in silver halide photographic materials as well as the spectral sensitization of semiconductor oxides also bear in some cases aspects of artificial photonic antenna systems ("Energy Migration in Dye-Loaded Hexagonal Microporous Crystals", Gfeller, N.; Calzaferri, G,. *J. Phys, Chem. B* 1997, 101, 1396-1408 and references cited therein).

However, to our knowledge, the system reported by us in "Fast Energy Migration in Pyronine-Loaded Zeolite L Microcrystals", Gfeller, N.; Megelski, S.; Calzaferri, G. *J. Phys. Chem B* 1999, 103, 1250-1257, is the first artificial photonic antenna that works well enough to deserve this name. In this artificial system, zeolite cylinders are adopted for forming a bi-directional photonic antenna wherein the light transport is made possible by specifically organized dye molecules that mimic the natural function of chlorophyll. Zeolites are materials with different cavity structures. Some of them occur in nature as a component of the soil. We use zeolite L crystals of cylindrical morphology which consist of a continuous channel system and we have succeeded in filling each individual channel with chains of joined but noninteracting dye molecules. Light shining on the cylinder is first absorbed and the energy is transported by the dye molecules inside the channels to the cylinder ends (*J. Phys. Chem. B* 1997, 101, 1396-1408; "Transfer of Electronic Excitation Energy between Dye Molecules in the Channels of Zeolite L", Gfeller, N.; Megelski, S.; Calzaferri, G. *J. Phys. Chem B* 1998, 102, 2433-2436; "Zeolite Microcrystals as Hosts for Supramolecular Organization of Dye Molecules", Calzaferri, G. *Chimia* 1998, 52, 525-532; "Fast Energy Migration in Pyronine-Loaded Zeolite L Microcrystals", Gfeller, N.; Megelski, S.; Calzaferri, G. *J. Phys. Chem B* 1999, 103, 1250-1257; "Dye Molecules in zeolite L nano crystals for efficient light harvesting", Calzaferri, G. in *Photofunctional Zeolites*, Nova Science Publishers NY, Editor. M. Anpo, 2000, 205-218; Pauchard, M.; Deveaux, A.; Calzaferri, G. "Dye-Loaded Zeolite L Sandwiches", *CHEMISTRY a Eur. J.* 2000, 6, 3456-3470).

Figure 1:
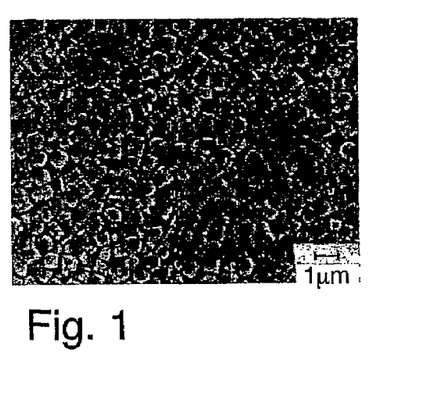
FIG. 1 is a micrograph showing a Zeolite L material.

We have previously synthesized nanocrystalline zeolite L cylinders ranging in length from 300 nm to about 3000 nm. A cylinder of 600 nm consists of, for example, about 100,000 channels arranged essentially parallel to each other. A typical zeolite L material of this kind is shown in FIG. 1. Single molecules of the luminescent dye oxonine, which is capable of emitting light in the red wavelength range, were inserted into ends of the zeolite's channels that had previously been filled with the luminescent dye pyronine, which is capable of emitting light in the green wavelength range. By means of this arrangement, experimental proof was furnished that efficient light transport is possible in such zeolite systems. Light of appropriate wavelength impinging on the zeolite is absorbed by pyronine molecules only. After such an absorption process, the energy moves along the molecules in the zeolite channel until it reaches a terminal oxonine molecule. The oxonine absorbs the energy by a radiationless energy transfer process, but is not able to send the energy back to the pyronine. Instead, it emits the energy in the form of red light, visible to the naked eye.

Figure 2:
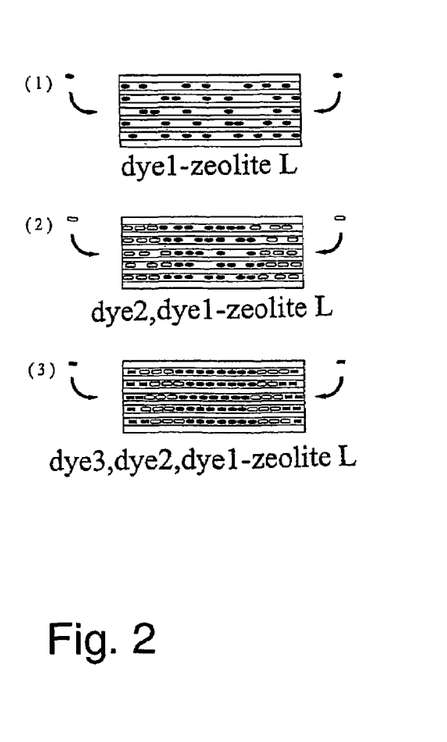
FIG. 2 is a scheme illustrating the preparation of a three-dye loaded Zeolite L.
Figure 3:
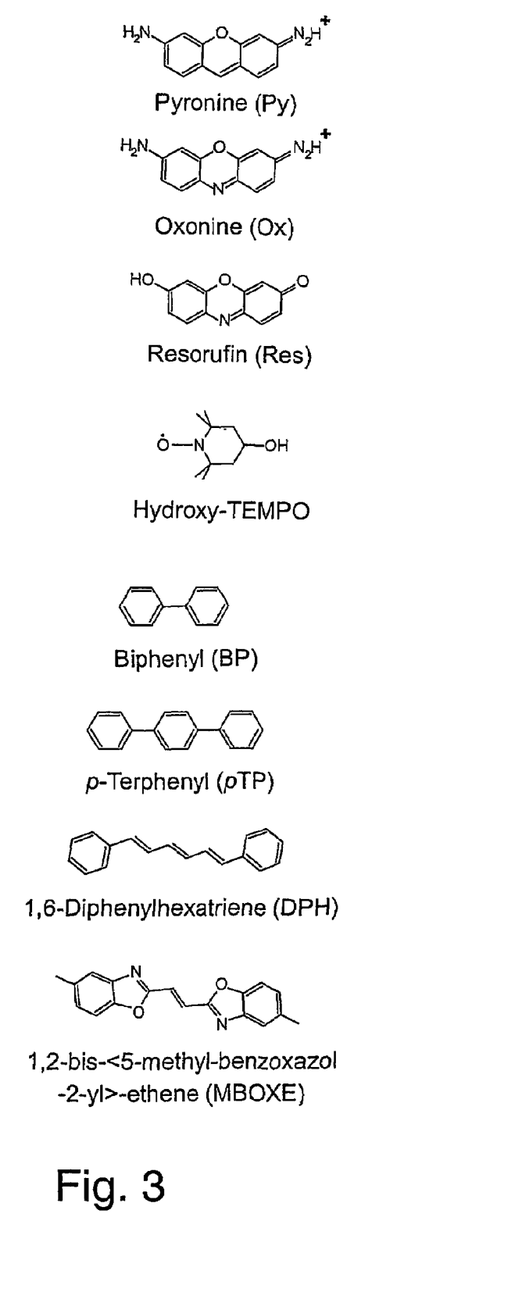
FIG. 3 shows examples of luminescent dye molecules that can be inserted in Zeolite L.

We have developed two methods for preparing suitable dye loaded zeolite materials, one method working at a solid/liquid interface and the other method working at a solid/gas interface. Other approaches for preparing similar materials are in situ and crystallization inclusion synthesis. In our previous work, cationic dyes have been inserted into the channels of zeolite L via ion exchange from a suspension, thus leading to zeolite L materials with donor molecules located in the middle and acceptor molecules at the channel ends. After selective electronic excitation of the donor molecules, fast energy migration along the c-axis and energy transfer at the channel ends to the acceptor molecules was observed. Subsequently, we have succeeded in preparing three-dye-loaded zeolite L sandwiches. The general concept of the preparation method of these materials is illustrated in FIG. 2 and a selection of molecules that have been studied is given in FIG. 3. First, a neutral dye molecule is inserted e.g. from the gas phase, filling the channels to the desired degree. Provided that the inserted molecules are not rapidly displaced by water, this material can then be ion exchanged with a second dye. This can be well controlled, so that a specifically desired space is left for the third dye, which is either inserted in a next ion exchange process, or from the gas phase. We have shown that by these means a bi-directional antenna for light collection and transport can been prepared so that the whole light spectrum can be used, transporting light energy from blue to green to red.

Within the context of this work several reactions and equilibria play a role and have been discussed: Insertion reaction of neutral dyes, adsorption at the outer surface, hydration, displacement and reinsertion reactions, and cation exchange. Many data have been obtained for p-terphenyl (pTP). The size of pTP and its chemical properties make it an excellent model for studying relevant parameters and for developing new preparation methods. The first bi-directional three-dye-zeolite L sandwich antenna has been realized with DPH as first luminescent dye. We have observed that the energy of near UV light that is absorbed in the middle part of the antenna by DPH is transferred to adjacent pyronine molecules, i.e. to the second luminescent dye, along which it migrates until it reaches the pyronine/oxonine interface, where a further energy transfer occurs from pyronine to oxonine, i.e. to the third luminescent dye (Calzaferri, G.; Brühwiler, D.; Megelski, S.; Pfenniger, M.; Pauchard, M.; Hennessy, B.; Maas, H.; Déveaux, A.; Graf, U. "Playing with Dye Molecules at the Inner and Outer Surface of Zeolite L", *Solid State Sciences*, 2000, Volume 2, 421-447, incorporated herein by reference).

Beyond being usable for a light harvesting system, the principles described are expected to be exploitable in numerous other applications. However, the dye loaded zeolite materials and any devices made thereof that have so far been described, exhibit a number of significant shortcomings and disadvantages. In particular, the stability of such systems is still unsatisfactory, mainly because of an undesirable migration of the luminescent dye molecules out of the zeolite channels resulting in a depletion of the dye loaded zeolite material.

Moreover, the tasks of external trapping of excitation energy or—conversely—of injecting energy at a specific point of the photonic antenna, the realization of a monodirectional photonic antenna and the coupling of such photonic antennae to specific devices have not been solved so far.

SUMMARY OF THE INVENTION

Accordingly, it is an object of the present invention to overcome the above discussed shortcomings and disadvantages associated with the dye loaded zeolite materials and any devices made thereof that have so far been described.

In particular, it is an object of this invention to provide a dye loaded zeolite material that is suitable for a wide variety of applications and that shows improved stability as compared to known dye loaded zeolite materials.

Further objects of this invention are to provide a pigment material showing improved stability, to provide a luminescent optical device, to provide an optical sensor device, to provide a light emitting device and to provide a photonic energy harvesting device.

According to one aspect of this invention, there is provided a dye loaded zeolite material comprising:
 a) at least one zeolite crystal having straight through uniform channels each having a channel axis parallel to, and a channel width transverse to, a c-axis of crystal unit cells;
 b) closure molecules having an elongated shape and consisting of a head moiety and a tail moiety, the tail moiety having a longitudinal extension of more than a dimension of the crystal unit cells along the c-axis and the head moiety having a lateral extension that is larger than said channel width and will prevent said head moiety from penetrating into a channel;
 c) a channel being terminated, in generally plug-like manner, at least at one end thereof located at a surface of the zeolite crystal by a closure molecule whose tail moiety penetrates into said channel and whose head moiety substantially occludes said channel end while projecting over said surface; and
 d) said zeolite material further comprising an essentially linear arrangement of luminescent dye molecules enclosed within a terminated channel adjacent to at least one closure molecule and exhibiting properties related to supramolecular organization.

According to a further aspect of this invention, there is provided a pigment material showing improved stability, comprising a dye loaded zeolite material as set forth hereinabove.

According to another aspect of this invention, there is provided a luminescent optical device comprising a dye loaded zeolite material as set forth hereinabove, wherein said dye molecules are selected such as to have a substantial luminescence quantum yield for a predetermined excitation wavelength.

According to a still further aspect of this invention, there is provided an optical device comprising a dye loaded zeolite material as set forth hereinabove, wherein said dye molecules are selected such as to have a substantial luminescence quantum yield for a predetermined excitation wavelength, and wherein said closure molecule and said dye molecules are capable of interacting in such manner that an external influence exerted on the head moiety of the closure molecule results in a change of said luminescence quantum yield.

According to another aspect of this invention, there is provided a segmented dye loaded zeolite material comprising:
 a) at least one zeolite crystal having straight through uniform channels each having a channel axis parallel to, and a channel width transverse to, a c-axis of crystal unit cells;
 b) closure molecules having an elongated shape and consisting of a head moiety and a tail moiety, the tail moiety having a longitudinal extension of more than a dimension of the crystal unit cells along the c-axis and the head moiety having a lateral extension that is larger than said channel width and will prevent said head moiety from penetrating into a channel;
 c) a channel being terminated, in generally plug-like manner, at least at one end thereof located at a surface of the zeolite crystal by a closure molecule whose tail moiety penetrates into said channel and whose head moiety substantially occludes said channel end while projecting over said surface; and d) an essentially linear arrangement of luminescent dye molecules enclosed within a terminated channel and exhibiting properties related to supramolecular organization, said arrangement comprising at least two segments disposed in a sequence of adjacent segments, each segment comprising an essentially linear arrangement of identical dye molecules, at least one of said segments forming a terminal segment adjacent at one end thereof to a closure molecule, the dye molecules in each one of said segments having an optical transition system comprising an absorption band and an emission band, said absorption band being generally blue-shifted and said emission band being generally red-shifted from a nominal wavelength of the optical transition system, the dye molecules of adjacent segments having respective optical transition systems in substantial spectral overlap with each other, said sequence of adjacent segments being spectrally ordered with respect to said nominal wavelengths.

The terminal segment may hereby comprise dye molecules with an optical transition system in substantial spectral overlap with an optical transition system of the closure molecule adjacent to said terminal segment. The sequence of adjacent segments may also be spectrally ordered with the nominal wavelengths increasing along the sequence away from said terminal segment. The sequence of adjacent segments may, in another embodiment of this aspect of the invention, be spectrally ordered with the nominal wavelengths decreasing along said sequence away from said terminal segment.

According to yet another aspect of this invention, there is provided a light emitting device comprising a segmented dye loaded zeolite material as set forth hereinabove, wherein said sequence of adjacent segments is spectrally ordered with said nominal wavelengths increasing along said sequence away from said terminal segment, said closure molecule and the dye molecules of said terminal segment being capable of interacting in such manner that energization of the head moiety of the closure molecule results in an energy transfer to the optical transition system of the dye molecules of said terminal segment.

The sequence of adjacent segments may hereby comprise an internal segment separated from said closure molecule by at least one further segment. The internal segment may hereby extend along a substantial part of the respective channel.

According to still another aspect of this invention, there is provided a photonic energy harvesting device comprising a segmented dye loaded zeolite material as set forth hereinabove, wherein said sequence of adjacent segments is spectrally ordered with said nominal wavelengths decreasing along said sequence away from said terminal segment, said closure molecule and the dye molecules of said terminal segment being capable of interacting in such manner that energization of the optical transition system of the dye molecules of said terminal segment results in an energy transfer to the head moiety of the closure molecule.

BRIEF DESCRIPTION OF THE DRAWINGS

The above mentioned and other features and objects of this invention and the manner of achieving them will become more apparent and this invention itself will be better understood by reference to the following description of various embodiments of this invention taken in conjunction with the accompanying drawings, wherein.

The exemplifications set out herein are not to be construed as limiting the scope of this disclosure or the scope of this invention in any manner.

DETAILED DESCRIPTION OF THE INVENTION

1. Zeolite Materials

Zeolite materials suitable to act as hosts for supramolecular organization of molecules, particularly luminescent dye molecules, have been described (see references cited in the description of the prior art). The present work is based on the known materials Zeolite L and Zeolite ZSM-12. While these nanoporous materials have favorable properties, they are not, however, the only ones that could be used to produce the materials and devices described hereinbelow. Nevertheless, we will henceforth concentrate on Zeolite L nano crystals as shown in FIG. 1, noting that an even more homogeneous size distribution as the one shown can be obtained by applying size selective sedimentation.

Said Zeolite L nano crystals exhibiting cylinder morphology have straight through uniform channels each having a channel axis parallel to, and a channel width transverse to, a c-axis of crystal unit cells. As an essential feature of the present invention, closure molecules are provided having an elongated shape and consisting of a head moiety and a tail moiety, the tail moiety having a longitudinal extension of more than a dimension of the crystal unit cells along the c-axis and the head moiety having a lateral extension that is larger than said channel width and will prevent said head moiety from penetrating into a channel. Accordingly, said channel is terminated, in generally plug-like manner, at least at one end thereof located at a surface of the zeolite crystal by a closure molecule whose tail moiety penetrates into said channel and whose head moiety substantially occludes said channel end while projecting over said surface. Within such terminated channel, luminescent dye molecules are enclosed, forming an essentially linear arrangement and exhibiting properties related to supramolecular organization.

2. Closure Molecules

A common principle of closure molecules is that they consist of a head moiety and a tail moiety, the head moiety being too large to enter into a channel of the zeolite host, whereas the tail moiety can penetrate into the end of said channel. Similar to a cork on a sparkling-wine bottle, the head moiety substantially occludes in a plug-like manner the channel end while projecting over a surface of the zeolite crystal.

There are many different embodiments of such closure molecules, which should be chosen depending on the specific type of application envisioned and depending on the type of zeolite host material used.

One may distinguish between hosts with an anionic framework such as Zeolite L or ZSM-12 and hosts with a neutral framework, such as $AlPO_4$-5 or VPI-5. No substantial difference in respect of these two types of host materials arises in those cases where the tail moiety is essentially electroneutral. In contrast, closure molecules with a positively charged tail moiety appear to be particularly interesting in conjunction with anionic hosts such as Zeolite L.

Figure 4:
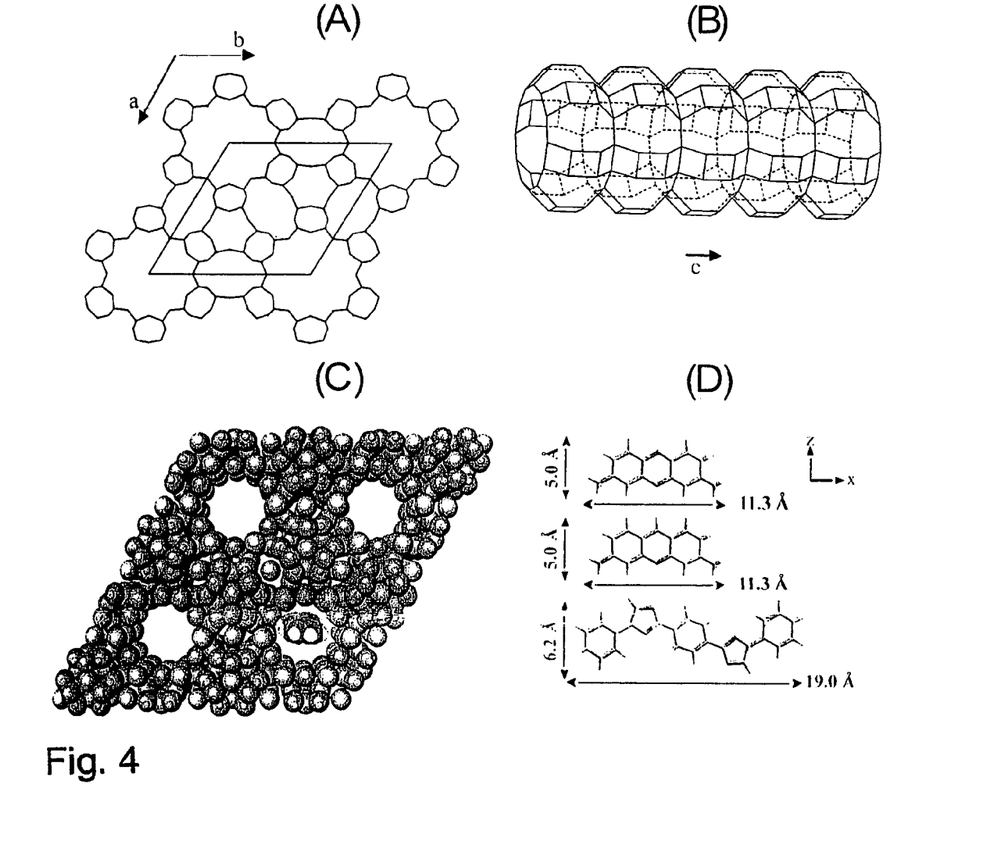
FIG. 4 shows relevant structures of Zeolite L and luminescent dye molecules, namely: left side: a top view of Zeolite L, perpendicular to the c-axis, displayed as stick-representation (upper panel, FIG. 4(A)) and as Van der Waals representation with an oxonine molecule entering the zeolite channel (lower panel, FIG. 4(C)), and right side: a side view of a channel along the c-axis, without bridging oxygen atoms (upper panel, FIG. 4(B)), and the structures of oxonine cation $Ox^+$ (top), pyronine cation $Py^+$ (middle) and POPOP (bottom) with atom to atom distances and the coordinate system (lower panel, FIG. 4(D))

In order to understand the prinicples and constraints regarding the interaction between closure molecules and zeolite host, one should consider the relevant structural parameters as shown in FIG. 4. The geometrical constraints imposed by the host determine the organization of the luminescent dye molecules within the channels and further define what types of closure molecules are able to fulfill the desired function. The main channels of Zeolite L consist of unit cells with a length of 7.5 Å in the c-direction, as illustrated in FIG. 4. The unit cells are joined by shared 12-membered ring windows having a free diameter of 7.1-7.8 Å. The largest free diameter is about 13 Å, depending on the charge compensating cations. It lies midway between the 12-membered rings. The lengths of the primitive vectors a and b are 18.4 Å. For example, a zeolite L crystal of 500 nm diameter and 375 nm length gives rise to about 67,000 parallel channels, each of which consists of 500 unit cells.

The three molecules displayed on the right hand side of FIG. 4 illustrate the typical size of molecules that can penetrate into the channels of zeolite L. However, these molecules are typical only from the point of view of their size, not from the point of view of their properties, because they do absorb light in the visible or in the near UV. In contrast, suitable tail moieties typically do not absorb light of a wavelength longer than about 300 nm.

Figure 5:
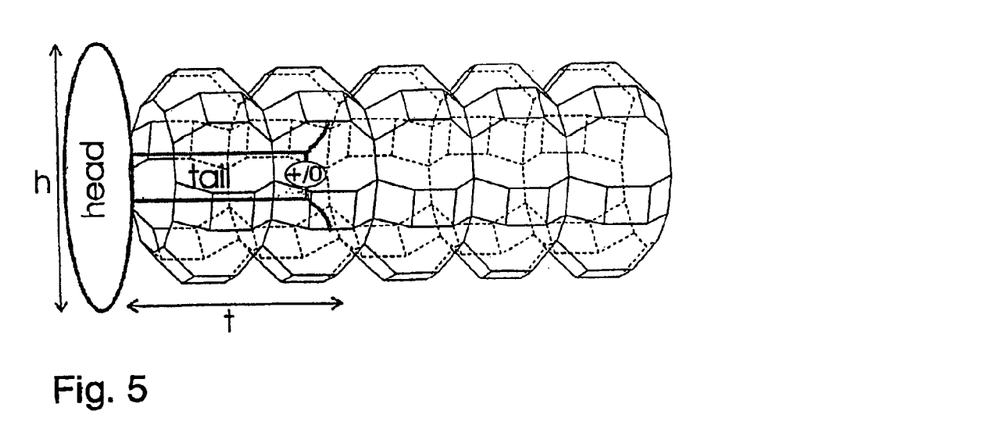
FIG. 5 shows structure of typical closure molecules acting as an injector-, acceptor-, or simply as a stopcock; the positive charge being desirable for anionic zeolite hosts and the zero charge being applicable for all cases.

The general structural characteristics illustrated in FIG. 5 are desirable for a closure molecule. The diameter h of the head moieties should be larger than about 8 Å and the length t of the tail should be such that it penetrates at least one unit cell (this means 6 Å or more for zeolite L).

3. Tail Moieties

Tail moieteis are generally based on organic or silicon/organic frameworks. Typical tail moieties will not absorb light of a wavelength longer than about 300 nm. However, exceptions do exist. Three types of tail moieties play a role, depending on the desired properties: (i) non reactive tail moieties; (ii) tail moieties that can undergo an isomerization process after insertion in a channel end under the influence of irradiation, heat or a reactive species that is sufficiently small; (iii) reactive tail moieties that can bind to molecules inside of the channels. It appears sufficient to provide some examples of closure molecules with type (i) tail moieties, because for cases (ii) and (iii) a wide spectrum of suitable reactions is known.

4. Head Moieties

Independently of its specific application, any head moiety must be large enough so that it cannot enter into a channel of the zeolite material. As a consequence of this general condition, any suitable head moiety will also substantially occlude the end of a channel into which the respective tail moiety is inserted, and it will project over the surface of the zeolite crystal at which said channel ends. In addition, head moieties must fulfill any stability criteria imposed by a specific application. In general, head moieties will comprise an organic, a silicon-organic or a coordination-type entity.

Advantageously, head moieties are selected so as to achieve a desired functionalization of the dye loaded zeolite's surface properties such as the wetting ability, the refractive index matching or the reactivity. For example, it might be desirable to select a closure molecule with a head moiety bearing reactive "arms", so that after loading the zeolite material an additional process could occur, whereby reactive arms of head moieties located near the ends of neighbouring channels could interact with each other to form a monolayer type polymer at the surface of the zeolite crystal.

Particular types of head moieties include acceptor-heads and donor-heads. Acceptor-heads serve to accept an excitation energy transferred to them by a nearby dye molecule located within the channel. In general, acceptor-heads are strongly luminescent entities having a large spectral overlap with the dye molecules located inside of the channels. In contrast, donor-heads must be able to transfer an initially received excitation energy to a nearby dye molecule located within the channel. These energy transfer processes are generally radiationless, mostly based on dipole-dipole coupling.

Since luminescence is quenched by dimerization, the head moieties should be prevented from interacting electronically with each other. For this purpose, it may be necessary to shield a chromophoric part of a head moiety by attaching to it one or more inactive substituents such as aliphatic groups.

While a large number of chemical entities could be used as head moieties, practical constraints of various type might limit the selection based on requirements for stability, particular shape, non-toxicity and so forth.

5. Examples of Closure Molecules

Figure 6:
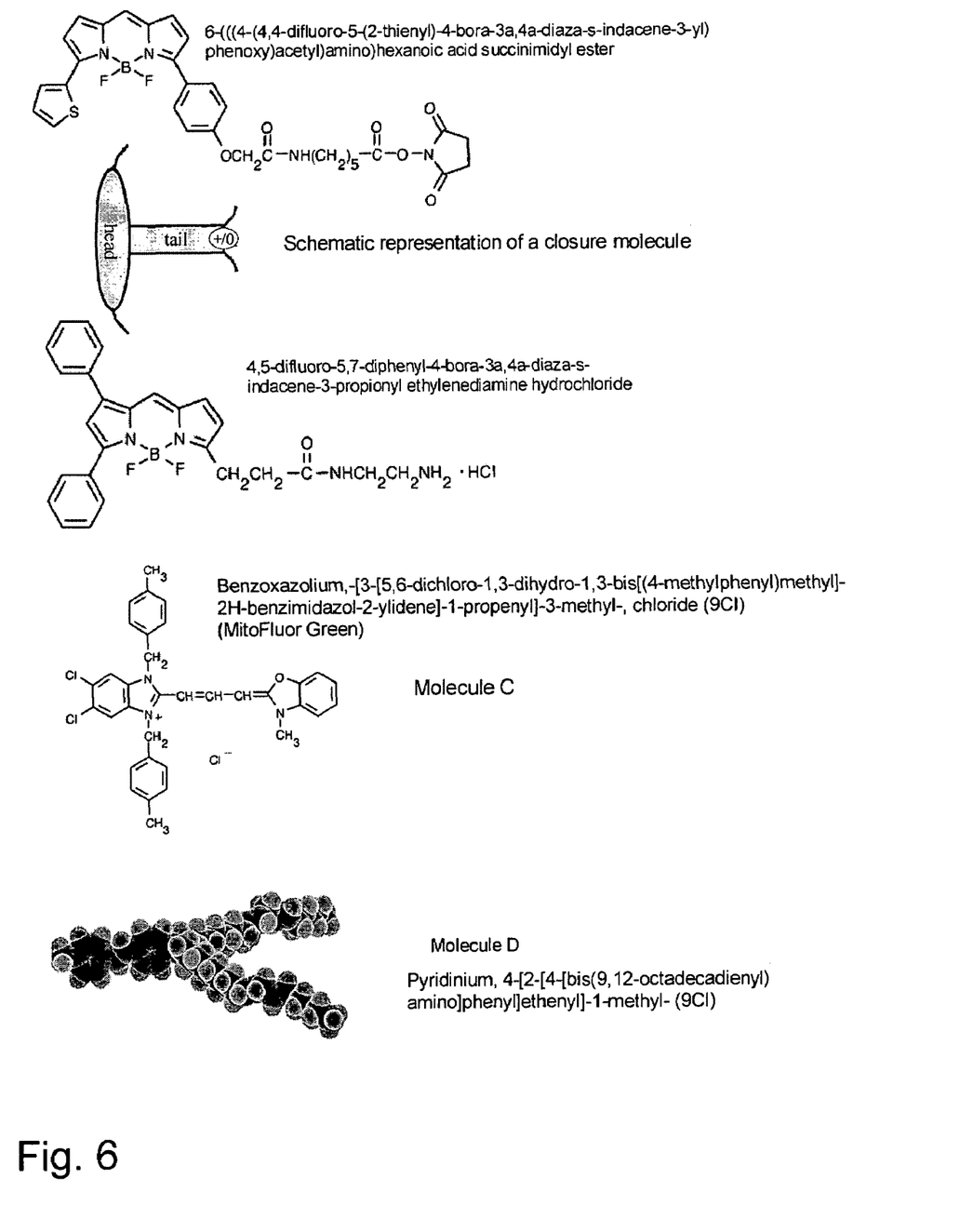
FIG. 6 shows examples of closure molecules with head moieties that can act as acceptor-heads but also as donor-heads, depending on the type of dye molecules residing inside of the channels.

A small selection of commercially available molecules suitable as closure molecules is compiled in FIG. 6, showing, from the top to the bottom:

6-(((4-(4,4-difluoro-5-(2-thienyl)-4-bora-3a,4a-diaza-s-indacene-3-yl)phenoxy)acetyl)amino)hexanoic acid succinimidyl ester;

a schematic representation of a closure molecule;

4,5-difluoro-5,7-diphenyl-4-bora-3a,4a-diaza-s-indacene-3-propionyl ethylenediamine hydrochloride;

"Molecule C" (benzoxazolium,-[3-[5, 6-dichloro-1, 3-dihydro-1, 3-bis[(4-methylphenyl)methyl]-2H-benzimidazol-2-ylidene]-1-propenyl]-3-methyl-, chloride (9CI) (MitoFlour Green); and "Molecule D" (pyridinium, 4-[2-[4-[bis(9, 12-octadecadienyl)amino]phenyl]ethenyl]-1-methyl-(9CI)).

A further compound usable as closure molecule is 4-(4-(dilinolethylamino)stiryl)-N-methylpryidinium. Still further closure molecules can be constructed, that comprise a head moiety such as a substituted porphyrin, a substituted rhodamine, a substituted ruthenium-tris-bipyridine or a substituted $C_{60}$.

6. Luminescent Dyes

Figure 7:
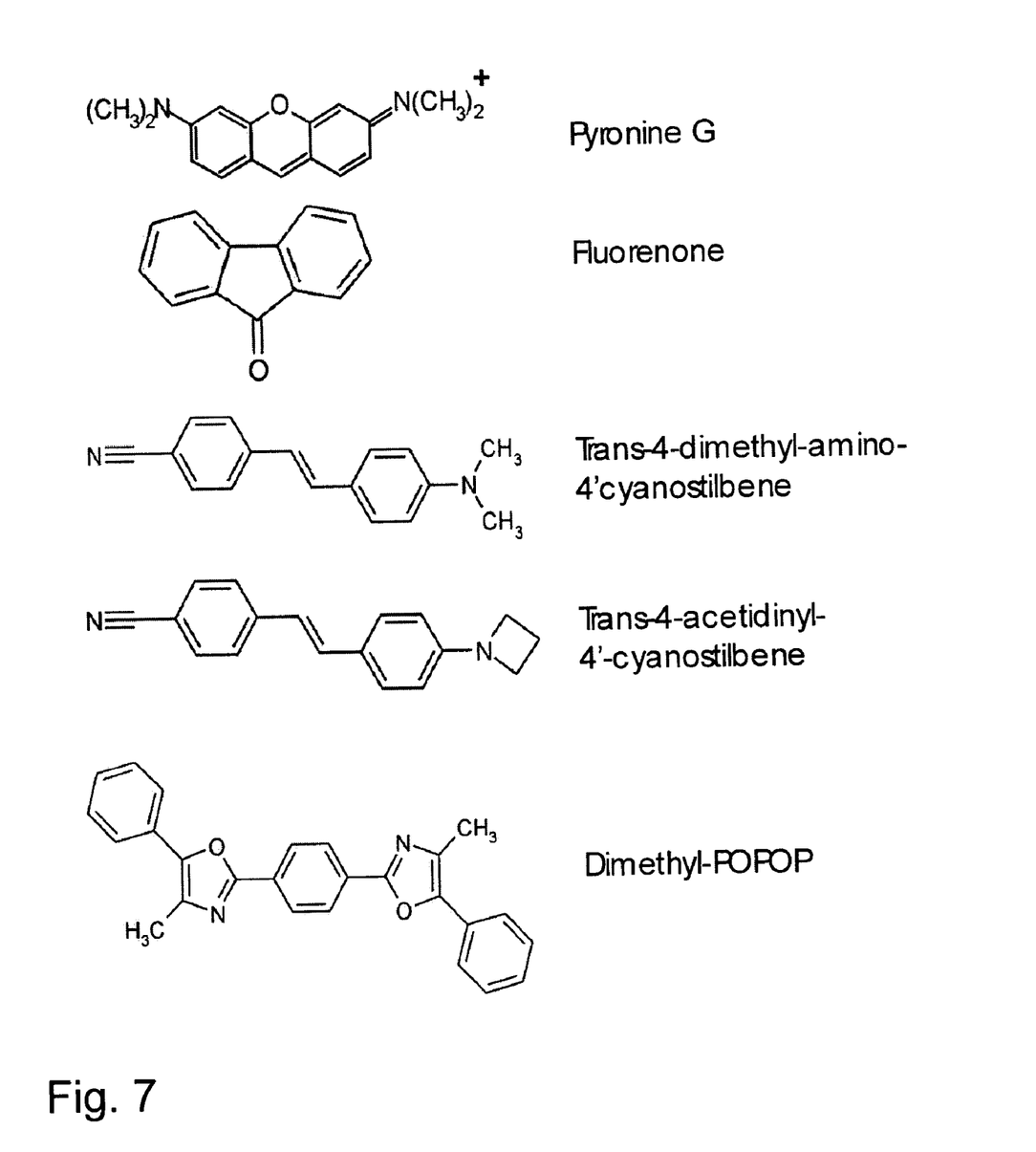
FIG. 7 shows further examples of luminescent dye molecules.

There is a very large number of luminescent dye molecules that are generally suited for insertion into the channels of Zeolite L, many of which have been specifically described in the literature cited hereinabove. We will simply mention the molecules shown in FIG. 3, i.e. biphenyl, pyronine, p-terphenyl, oxonine, 1,6-diphenylhexatriene, resorufin, 1,2-bis-(5-methyl-benzoxazol-2yl)-ethene and 4-hydroxy-2,2,6,6-tetramethylpiperidine-1-oxyl, the latter being also known as Hydroxy- TEMPO. Further suitable luminescent dye molecules are p-bis[2-(5-phenyloxazolyl)]-benzene, also known as POPOP, as well as the dye molecules listed in Table 2 of "Zeolite Microcrystals as Hosts for Supramolecular Organization of Dye Molecules", Calzaferri, G. *Chimia* 1998, 52, 525-532, which is explicitly incorporated herein by reference. Still further suitable luminescent dye molecules are shown in FIG. 7, which shows, from top to the bottom:
  pyronine G,
  fluorenone,
  trans-4-dimethly-amino-4'-cyanostilbene,
  trans-4-acetidinyl-4-cyanostilbene, and
  1,4-bis(4-methyl-5-phenyl-2-oxazolyl)-benzene (also known as dimethyl-POPOP).

7. Dye Loaded Zeolite Materials

In the simplest case, a dye loaded zeolite material as described hereinabove comprises an essentially linear arrangement of luminescent dye molecules enclosed within a terminated channel. This arrangement is adjacent to at least one closure molecule. By virtue of their specific arrangement resembling a bead chain, a plurality of dye molecules enclosed within a channel exhibits properties related to supramolecular organization.

Figure 8:
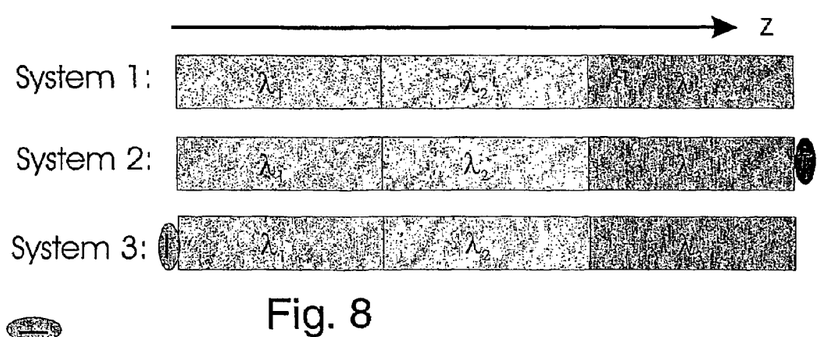
FIG. 8 shows examples of segmented dye loaded zeolite systems.

By extension of the principle just described, a segmented dye loaded zeolite material can be envisioned as shown in FIG. 8, wherein an essentially linear arrangement of luminescent dye molecules enclosed within a terminated channel and exhibiting properties related to supramolecular organization comprises at least two segments disposed in a sequence of adjacent segments. Each segment comprises an essentially linear arrangement of identical dye molecules. At least one of said segments forms a terminal segment that is adjacent at one end thereof to a closure molecule. The dye molecules in each one of said segments have an optical transition system comprising an absorption band and an emission band, said absorption band being generally blue-shifted and said emission band being generally red-shifted from a nominal wavelength $\lambda$ of the optical transition system. It should be noted that the terms "blue-shifted" and "red-shifted" are to be understood in the sense of "shifted to shorter wavelengths" and "shifted to longer wavelengths", respectively, as customary in spectroscopy. The dye molecules of adjacent segments have respective optical transition systems in substantial spectral overlap with each other, and said sequence of adjacent segments is spectrally ordered with respect to said nominal wavelengths.

Referring again to FIG. 8, a nano crystal of cylinder morphology with a typical length of 600 nm is divided along its longitudinal channel axis in 3 parts, e.g. with a length of ~200 nm each. The arrangement labelled as "System 1" in FIG. 8 simply shows the principle of a segmented arrangement comprising a first segment with dye molecules having a nominal wavelength $\lambda_1$, a second segment with dye molecules having a nominal wavelength $\lambda_2$ and a third segment with a dye having a nominal wavelength $\lambda_3$, but without showing the respective closure molecules at the channel end. The dye molecules are preferably strongly luminescent and their nominal wavelengths fulfill the condition $\lambda_1 < \lambda_2 < \lambda_3$. Moreover, the spectral overlap integral of the optical transition systems of the dye molecules in adjacent segments is large. In such an arrangement, very fast Förster-type energy migration along the z axis is expected, supported by self-absorption and re-emission processes. The dimensions of the nano crystal are in the order of the wavelength of the light.

More specifically, "System 2" comprises a closure molecule T placed at the $\lambda_3$-end of the segmented arrangement. Closure molecule T, typically a porphyrine or a phthalocyanine, further acts as an acceptor-head enabled to function as an excitation trap. Conversely, "System 3" comprises a closure molecule I placed at the $\lambda_1$-end of the segmented arrangement and acting as a donor-head capable to function as an energy injector. A segmented dye loaded zeolite crystal of the type displayed as "System 2" or "System 3" can be connected to a quantum size particle, a semiconductor, a conductor, a conjugated polymer, a quartz fiber and so forth, depending on the application envisaged.

EXAMPLE 1

Applications of Zeolite Materials Loaded with One Dye

With the dye loaded zeolite materials described hereinabove, it is possible to produce luminescent dye pigments with extremely high brilliance and stability. Materials with dye concentrations corresponding to 0.4 mol/L wherein the dyes are present as monomers and therefore are very luminescent and brilliant can easily be prepared, covering the whole visible spectrum. Independently of the dye used, these materials are nontoxic since the dye is encapsulated and cannot be released to the environment. Particle sizes between about 50 nm to 3000 nm can be made, absorptivity and color can easily be tuned, and refractive index coating is possible. Since the same basic zeolite material can be used for a large variety of dyes depending on the particular application, a large simplification and hence an enormous technological advantage is achieved.

As a further application, scintillation materials with extremely high sensitivity and versatility can be prepared with the dye loaded zeolite materials described hereinabove. It is simple to prepare stable layers on e.g. a plastic material of any shape. Very thin layers (e.g. of a few hundred nm) with nearly 100% absorptivity can thus be prepared.

Moreover, the dye loaded zeolite materials described hereinabove can be employed to build novel luminescent optical devices, such as dye lasers with dimensions of a few hundred nanometer, needles for scanning near field microscopes and other highly integrated optical devices. Such device could also encompass a highly efficient photosensitizer device applicable, e.g. to photodynamic therapy of malignant tissues. Since the absorptivity of a 50 nm dye zeolite particle is about 20,000 larger than that of a single dye molecules, the treatment could be carried out with much lower light intensity, which in some cases could be an important advantage.

EXAMPLE 2

Analytical Probes

Fluorescent molecules are used in many analytical applications in chemistry, biology including cell biology, medicine and environmental sciences. Many substances specifically designed for such applications are available on the market under the general technical term of "fluorescent molecular probes". In this context, a corresponding term for the dye loaded zeolite materials described herein would be that of "fluorescent nanoprobes". In comparison with conventional molecular probes, said zeolite material can enhance the sensitivity by a factor of up to about 100,000. Apart from this enormous amplification, nanoprobes based on the dye loaded zeolite materials according to the present invention do not blink, that is, the luminescence signal emitted by them is continuous in time, which has important advantages in some applications. Such nanoprobes can be made with sizes in the range of about 50 nm to 3000 nm, depending on the applications.

The number of unit cells of Zeolite L is given by $N_{uc}=0.35$ $nm^{-3} d_Z^2(nm) l_Z(nm)$ ($d_Z$=diameter of the zeolite, $l_Z$=length of the zeolite, both in nm). Hence, a 100 nm zeolite crystal consists of 350,000 unit cells. A typical dye molecule occupies 2 to 3 unit cells. This means that a 100 nm particle contains about 100,000 chromophores (dye molecules). A 50 nm crystal contains correspondingly 43,750 unit cells, which means up to about 20,000 chromophores. Each of them can absorb a light quantum coming in (this means that the probability of e.g. a 100 nm dye loaded crystal to absorb a light quantum is 100,000 larger than that of a single molecule).

A system for which efficient energy transfer has been found comprises a Zeolite L loaded with pyronine cations as dye molecules and provided with 6-(((4-(4,4-difluoro-5-(2-thienyl)-4-bora acid succinimidyl ester (i.e. the top molecule in FIG. 6), also known as BODIPY® TR-X SE as closure molecules. Upon illumination with green light causing electronic excitation of the entrapped dye molecules, a rapid transfer of energy to the head moieties of the closure molecules occurs, thus resulting in substantial fluorescence emission in the red spectral region. It is found that the relative intensity of this red fluorescence as compared to the intensity of the green fluorescence increases with increasing concentration of entrapped pyronine dye.

Because of the extremely fast energy migration, we have observed that in a dye loaded zeolite material according to the present invention, it is possible in favorable cases to quench this luminescence with a probability of more than 95% by a single molecule undergoing an interaction with a suitably chosen closure molecule. For example, a closure molecule can be selected the behavior of which depends on the nature of complexing ions such as $H^+$, alkali ions, $Ca^{2+}$, and similar, but also closure molecules the behavior of which depends on local viscosity, local polarity, protein adsorption and other specific interactions. Indeed, head moieties can be tailored in order to create highly specific nanoprobes. Such nanoprobes could be used in combination with all common techniques, stationary and time resolved, such as conventional fluorescence measurements, standard and unconventional microscopy techniques, fiber optic devices, etc. Optical sensing could be applied by monitoring a change of refractive index of an analyte solution in contact with the nanoprobe.

An efficient energy transfer has also been achieved in the opposite direction, i.e. from the closure molecule to the dye molecules entrapped in the zeolite system. For this purpose, a Zeolite L loaded with oxonine cations as dye molecules was provided with closure molecules consisting of BODIPY® 493/503 SE. Upon illumination with green light causing electronic excitation of the stopcock molecules, a rapid transfer of energy to the entrapped oxonine molecules occured, thus resulting in substantial fluorescence emission in the red spectral region.

EXAMPLE 3

Light Emitting Devices

Figure 9:
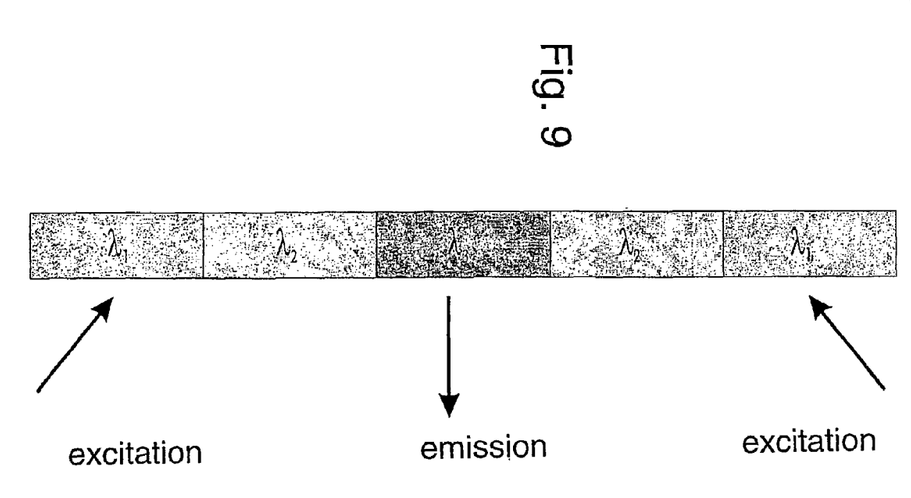
FIG. 9 shows the principle of an inverted antenna system.

A segmented dye loaded zeolite material according to the present invention can be used to construct a light emitting device, for which one needs to implement an inverted antenna system. An advantageous feature of said zeolite materials is that light of any color of the whole visible spectrum can be generated with basically the same material. Spatial resolution can be as low as 100 nm, since the limits thereto are imposed by the properties of light, i.e. diffraction, not by the material. We have recently been able to synthesize an inverted antenna system which can be explained by means of FIG. 9. Excitation travels in a radiationless process from both ends of the crystal towards the middle where it is emitted. The amount of blue, green and red emission can be tuned by varying the characteristics, e.g. the length, of the different regions. This means that excitation covering the whole visible spectrum can be generated by means of basically the same material.

Figure 10:
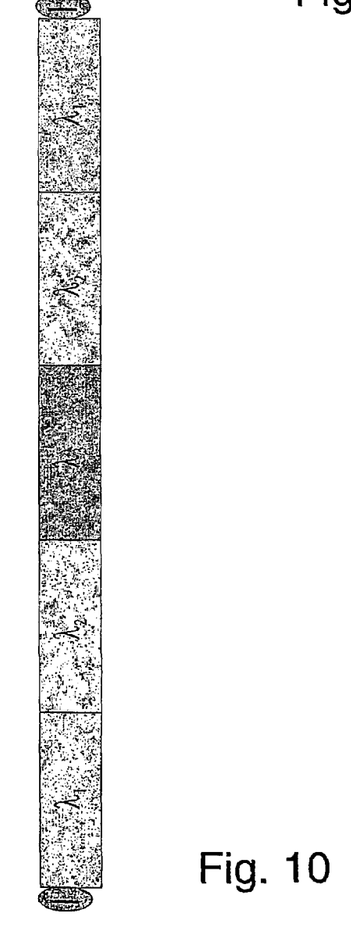
FIG. 10 shows a functionalized bi-directional inverted antenna which forms the basis of a light emitting device.

Energy supply to the light emitting device occurs as shown in the arrangement of FIG. 10. Initially, a closure molecule provided with a donor-head acting as an injector I is excited, which readily transfers its excitation energy in a radiationless process to the blue dye molecules in the adjacent terminal segment of the zeolite channel. From there, the inverted antenna transports the excitation energy segment-wise towards the middle of the crystal, where it is finally released as luminescence light. It is sufficient to connect with an excitation source only one end of the two closure molecules located at opposite ends of a given channel.

It is important to note that with the same injector I and the same blue dye in the terminal segment, light emission of any color can be realized by just varying the characteristics of the green and the red parts of the inverted antenna.

EXAMPLE 4

Photonic Energy Harvesting Devices

As a further application of segmented dye loaded zeolite systems according to the present invention, a new type of photonic energy harvesting device such as a solar cell can be realized. Such a device comprises a sequence of dye segments that is ordered in opposite order as compared to the light emitting device mentioned hereinabove, and with a closure molecule featuring an acceptor-head. Light absorbed by the dye molecules in one of the inner segments is efficiently transferred to the terminal segment and then to the closure molecule, from where it could then be fed into a suitable energy receiver or consumer system. The advantage of such a "dye sensitized solid state solar cell" with respect to current technologies is that in principle very cheap cells with very high efficiency (more than 30% for tandem devices) can be made based on nontoxic materials.

While only the preferred and some typical embodiments of this invention have been described hereinabove, it will be understood that the invention is not limited to the embodiments disclosed, but is equally capable of numerous other equivalent arrangements, rearrangements, modifications and substitutions of parts and elements, equivalently to achieve the functions, means, ways and results disclosed herein, without departing from the spirit and teaching of the invention, and are embodied in this invention.

EXAMPLE 5

Loading of a Cationic Dye into a Zeolite Preloaded with a Neutral Dye

Loading of a cationic dye like pyronine or pyronine G into a zeolite already loaded with a neutral dye presents the following difficulty. While the cationic dye would usually be added from an aqueous solution, it turns out that water tends to displace any neutral dye molecules present in the zeolite, i.e. the neutral dye molecules would be removed from the zeolite when attempting to add the cationic dye molecules. Accordingly, it is preferable to use a solvent like 1-butanol, which does not displace the neutral dye molecules from the zeolite. However, it turns out that the ion exchange reaction by means of which a cationic dye molecule entering the zeolite replaces a potassium ion is prevented by the poor solubility of potassium ions in 1-butanol. This problem is overcome by adding to the solution a so-called cryptand, a molecule with a very high affinity for potassium ions.

For example, samples of Zeolite L loaded with pyronine can be prepared by stirring a solution of pyronine in 1-butanol containing a 13-fold excess of the known cryptand molecule Kryptofix222® and Zeolite L at 50° C. for 44 hours.

The invention claimed is:

1. A device comprising a dye loaded zeolite material comprising:
   a) at least one zeolite crystal having straight through uniform channels each having a channel axis parallel to, and a channel width transverse to, a c-axis of crystal unit cells;
   b) closure molecules having an elongated shape and consisting of a head moiety and a tail moiety, the tail moiety having a longitudinal extension of more than a dimension of the crystal unit cells along the c-axis and the head moiety having a lateral extension that is larger than said channel width and will prevent said head moiety from penetrating into a channel;
   c) a channel being terminated, in generally plug-like manner, at least at one end thereof located at a surface of the zeolite crystal by a closure molecule whose tail moiety penetrates into said channel and whose head moiety substantially occludes said channel end while projecting over said surface; and
   d) an essentially linear arrangement of luminescent dye molecules enclosed within a terminated channel and exhibiting properties related to supramolecular organization.

2. The device of claim 1, wherein said essentially linear arrangement of luminescent dye molecules are adjacent to at least one closure molecule and have a substantial luminescence quantum yield for a predetermined excitation wavelength.

3. The device of claim 2, wherein said device is a scintillation detector, a scanning near field optical microscope or a photosensitizer.

4. The device of claim 2, wherein said closure molecule and said dye molecules are capable of interacting in such manner that an external influence exerted on the head moiety of the closure molecule results in a change of said luminescence quantum yield.

5. The device of claim 4, wherein said device is a optical sensor.

6. The device of claim 4, wherein said device is an analytical probe.

7. The device of claim 1, wherein said arrangement comprises at least two segments disposed in a sequence of adjacent segments, each segment comprising an essentially linear arrangement of identical dye molecules, at least one of said segments forming a terminal segment adjacent at one end thereof to said closure molecule, the dye molecules in each one of said segments having an optical transition system comprising an absorption band and an emission band, said absorption band being generally blue-shifted and said emission band being generally red-shifted from a nominal wavelength of the optical transition system, the dye molecules of adjacent segments having respective optical transition systems in substantial spectral overlap with each other, said sequence of adjacent segments being spectrally ordered with said nominal wavelengths increasing along said sequence away from said terminal segment; and wherein said closure molecule and said dye molecules of said terminal segment are capable of interacting in such manner that energization of the head moiety of the closure molecule results in an energy transfer to the optical transition system of the dye molecules of said terminal segment.

8. The device of claim 7, wherein said device emits light.

9. The device of claim 7, wherein said sequence of adjacent segments comprises an internal segment separated from said closure molecule by at least one further segment.

10. The device of claim 9, wherein said internal segment extends along a substantial part of the respective channel.

11. The device of claim 1, wherein said arrangement comprises at least two segments disposed in a sequence of adjacent segments, each segment comprising an essentially linear arrangement of identical dye molecules, at least one of said segments forming a terminal segment adjacent at one end thereof to said closure molecule, the dye molecules in each one of said segments having an optical transition system comprising an absorption band and an emission band, said absorption band being generally blue-shifted and said emission band being generally red-shifted from a nominal wavelength of the optical transition system, the dye molecules of adjacent segments having respective optical transition systems in substantial spectral overlap with each other, said sequence of adjacent segments being spectrally ordered with said nominal wavelengths decreasing along said sequence away from said terminal segment; and wherein said closure molecule and the dye molecules of said terminal segment are capable of interacting in such manner that energization of the optical transition system of the dye molecules of said terminal segment results in an energy transfer to the head moiety of the closure molecule.

12. The device of claim 11, wherein said device harvests photonic energy.

13. The device of claim 11, wherein said closure molecule is capable of converting an energy received from said terminal segment to electric energy.

14. The device of claim 11, wherein said closure molecule is capable of converting an energy received from said terminal segment to photonic energy.

15. The device of claim 1, wherein the luminescent dye molecules are selected from the group consisting of
 biphenyl,
 pyronine,
 p-terphenyl,
 oxonine,
 1,6-diphenylhexatriene,
 resorufin,
 1,2-bis-(5-methyl-benzoxazol-2yl)-ethene,
 p-bis[2-(5-phenyloxazolyl)]benzene,
 4-hydroxy-2,2,6,6-tetramethylpiperidine-1-oxyl,
 pyronine G,
 fluorenone,
 trans-4-dimethly-amino-4'cyanostilbene,
 trans-4-acetidinyl-4'-cyanostilbene, and
 dimethyl-POPOP and wherein the closure molecules are selected from the group consisting of
 6-(((4-(4,4-difluoro-5-(2-thienyl)-4-bora-3a,4a-diaza-s-indacene-3-yl)phenoxy)acetyl)amino)hexanoic acid succinimidyl ester,
 4,5-difluoro-5,7-diphenyl-4-bora-3a,4a-diaza-s-indacene-3-propionyl ethylenediamine hydrochloride,
 benzoxazolium ,-[3-[5,6-dichloro-1,3-dihydro-1,3-bis[(4-methylphenyl)methyl]-2H-benzimidazol-2-ylidene]-1-propenyl]-3-methyl-, chloride (9Cl),
 pyridinium, 4-[2-[4-[bis(9,12-octadecadienyl)amino]phenyl]ethenyl]-1-methyl-(9Cl), and
 4-(4-(dilinolethylamino)stiryl)-N-methylpryidinium.

* * * * *